United States Patent [19]

Nitta et al.

[11] Patent Number: 5,058,120

[45] Date of Patent: Oct. 15, 1991

[54] VISIBLE LIGHT EMITTING SEMICONDUCTOR LASER WITH INVERSE MESA-SHAPED GROOVE SECTION

[75] Inventors: Koichi Nitta, Kawasaki; Yukio Watanabe, Yokohama; Yukie Nishikawa, Narashino; Masaki Okajima, Kawasaki; Genichi Hatakoshi, Yokohama, all of Japan

[73] Assignee: Kabushiki Kaisha Toshiba, Kawasaki, Japan

[21] Appl. No.: 634,546

[22] Filed: Dec. 27, 1990

[30] Foreign Application Priority Data

Feb. 28, 1990 [JP] Japan .................................. 2-45964
Mar. 30, 1990 [JP] Japan .................................. 2-84668
Mar. 30, 1990 [JP] Japan .................................. 2-84669

[51] Int. Cl.$^5$ ............................................... H01S 3/19
[52] U.S. Cl. ........................................ 372/46; 372/45
[58] Field of Search .................................. 372/46, 45

[56] References Cited

U.S. PATENT DOCUMENTS

| | | | |
|---|---|---|---|
| 4,567,060 | 1/1986 | Hayakawa et al. | 372/46 |
| 4,734,385 | 3/1988 | Mihashi et al. | 372/45 |
| 4,800,565 | 1/1989 | Yoshizawa et al. | 372/46 |
| 4,841,535 | 6/1989 | Michashi et al. | 372/46 |
| 4,910,743 | 3/1990 | Ohaba et al. | 372/46 |
| 4,982,409 | 1/1991 | Kinoshita et al. | 372/46 |

*Primary Examiner*—Georgia Epps
*Attorney, Agent, or Firm*—Oblon, Spivak, McClelland, Maier & Neustadt

[57] ABSTRACT

A visible light emitting semiconductor laser has a double-heterostructure section above the N-type GaAs substrate, which is composed of a nondoped InGaP active layer sandwiched between an N type InGaAlP cladding layer and a P type InGaAlP cladding layer. A P type InGaP thin-film layer formed on the P type cladding layer functions as an etching stopper. Formed sequentially on the etching stopper layer are a P type cladding layer and an N type GaAs current-blocking layer, which have a stripe-shaped groove section in and around their central portion. The groove section has an opening at the top and the bottom portion narrower than the opening, presenting an inverse-trapezoidal cross-sectional profile. This arrangement makes the width of the optical confinement region of the semiconductor laser narrower than that of the current injection region.

16 Claims, 8 Drawing Sheets

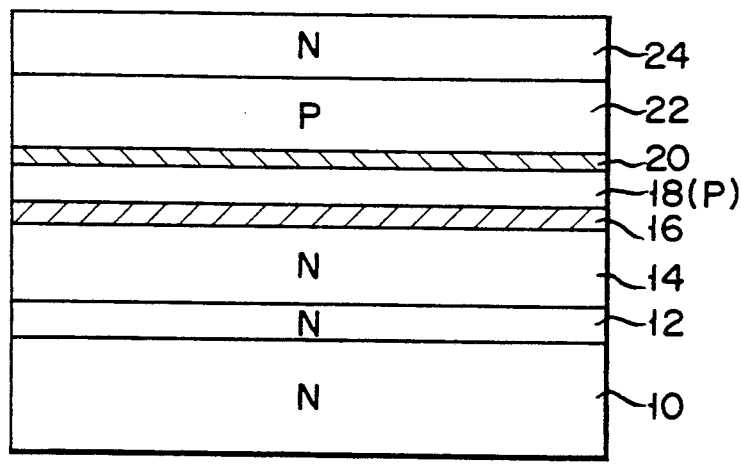
F I G. 1A
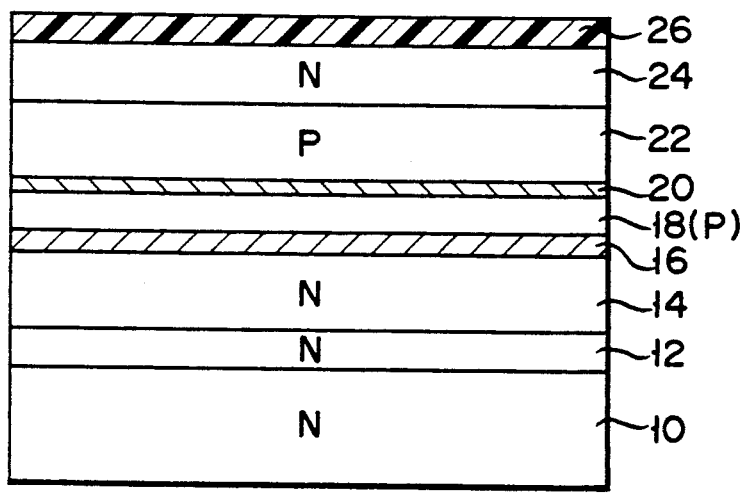
F I G. 1B

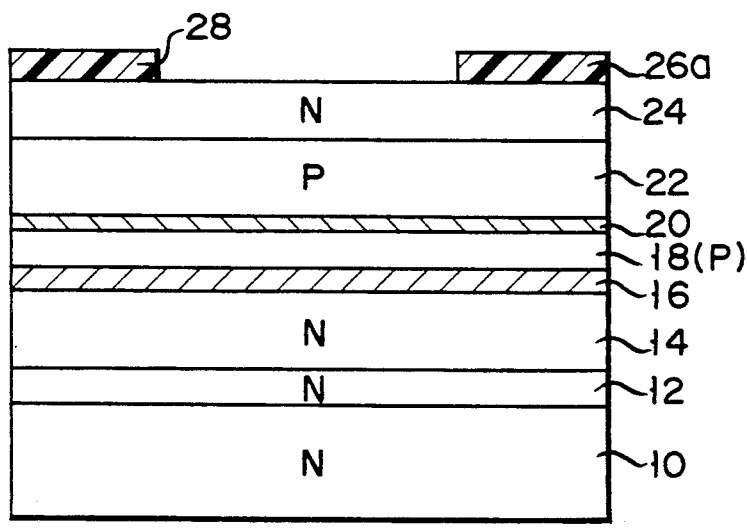
F I G. 1C
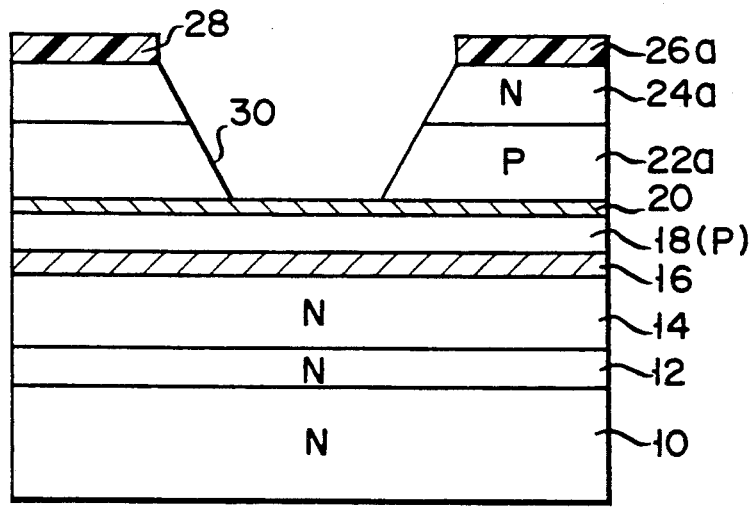
F I G. 1D

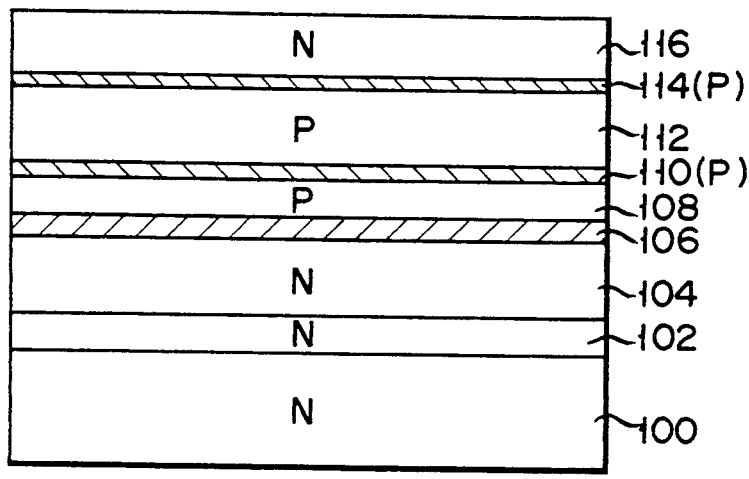
F I G. 2A
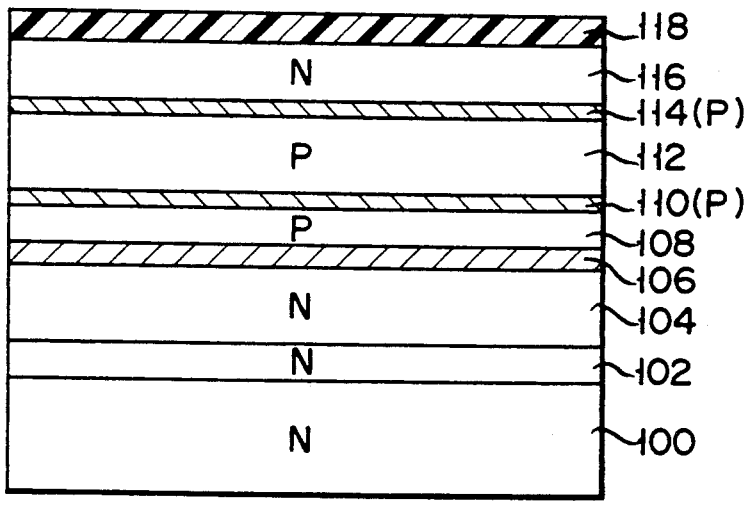
F I G. 2B
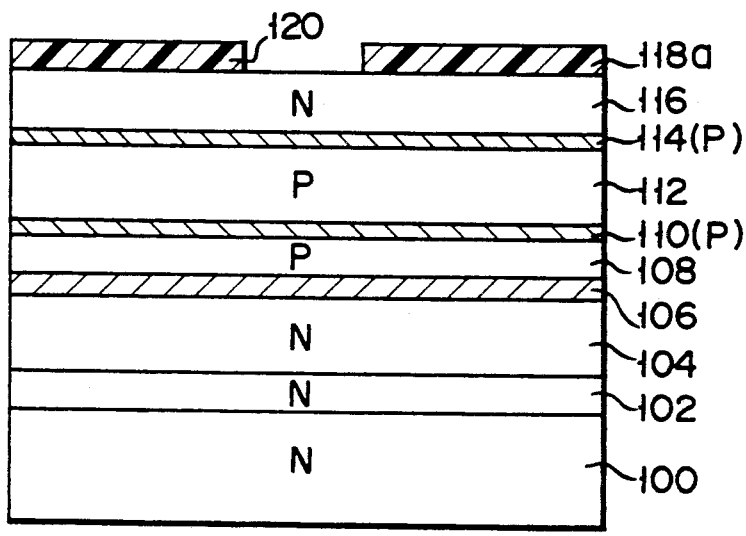
F I G. 2C

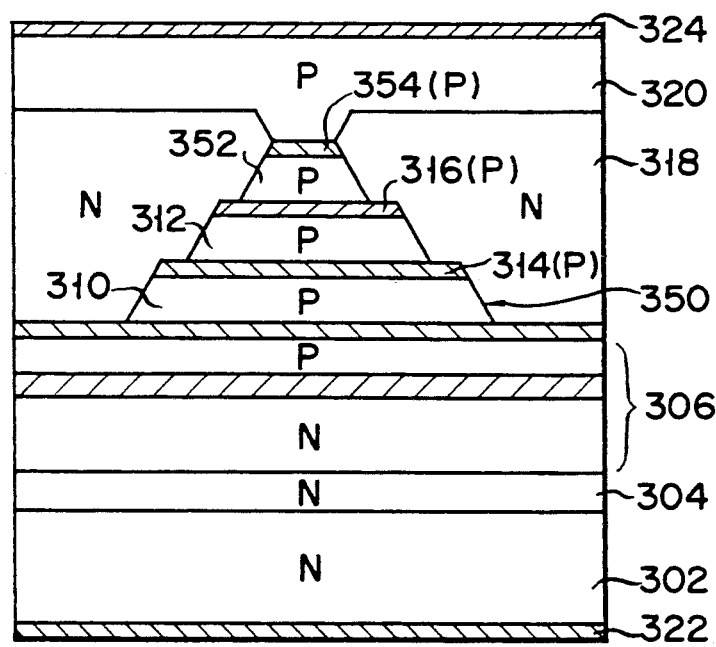
F I G. 5

VISIBLE LIGHT EMITTING SEMICONDUCTOR LASER WITH INVERSE MESA-SHAPED GROOVE SECTION

BACKGROUND OF THE INVENTION

1. Field of the Invention

The present invention relates to visible light emitting semiconductor laser devices, and more particularly to a transverse-mode stabilized semiconductor laser with an index waveguide structure and the manufacturing method thereof.

2. Description of the Related Art

The recently increasing need for highly-reliable, highly-efficient image processing systems calls for the development of highly-efficient semiconductor lasers with the desired oscillation wavelength. In connection with this, semiconductor-crystal growing techniques such as the metal organic-chemical vapor deposition or the MOCVD method have made remarkable advances lately. Such highly-advanced manufacturing techniques make it much easier for the semiconductor manufacturers to fabricate red-wavelength band semiconductor lasers, which have almost the same oscillation wavelengths as those of conventional helium-neon gas lasers.

Semiconductor laser devices are suitable for a light source for image information recording/reproducing systems with optical-disk recording mediums (usually known as "optical disk systems") and digital-computer-controlled page printing apparatus producing, at a high speed, high-quality hard copies that can carry pictures as needed (normally known as "laser printers"). In these applications, semiconductor lasers must have a high oscillation efficiency, an excellent controllability, and a low-power consumption. To meet these requirements, it is important to reduce the astigmatism of semiconductor lasers, increase the stability of transverse-mode laser oscillation, and lower the threshold current. Some commercially available semiconductor lasers, however, are insufficient to meet these requirements.

One major factor behind this lies in the waveguide absorption loss through the semiconductor laser, an undesirable phenomenon in which some rays of the oscillation light directed by the active layer deflect toward an unexpected direction due to errors in the imaginary part of the complex index of refraction in the parallel direction with the junction surface. Once such a waveguide absorption loss occurs, the threshold current will rise accordingly. The increased threshold current increases not only the power consumption, but also the astigmatism, thus decreasing the oscillation efficiency seriously. In addition, the linearity of the current-light output characteristics also deteriorates, with the result that what is called a kink takes place.

SUMMARY OF THE INVENTION

It is therefore an object of the present invention to provide a new and improved semiconductor laser device and the manufacturing method thereof.

In accordance with the above object, the present invention is directed to a specific semiconductor laser device that oscillates laser beam in a stabilized transverse mode in a visible-light wavelength. The device includes a first-conductivity-type semiconductive substrate and a double-heterostructure section formed above the substrate. The double-heterostructure section is composed of a first cladding layer of the first-conductivity type, an active layer formed on the first cladding layer, and a second cladding layer of a second-conductivity type formed on the active layer. A third cladding layer of the selected-conductivity type is located above the second cladding layer. A current-blocking layer is formed on or above the third cladding layer. The third cladding layer and the current-blocking layer have a long, narrow groove section in the preselected region. An optical waveguide layer of the second-conductivity type is formed on the third cladding and the current-blocking layer so as to cover the groove section. A fourth cladding layer is formed on the optical waveguide layer. The long, narrow groove section is specifically arranged so as to have an inverse-trapezoidal cross-section that causes the optical confinement region of the semiconductor laser device to have a smaller width than the current injection region.

The present invention as well as its objects and advantages will become more apparent in the detailed description of the embodiments presented below.

BRIEF DESCRIPTION OF THE DRAWINGS

In the detailed description of the preferred embodiments of the present invention that follows, reference is made to the accompanying drawings in which:

FIGS. 1A to 1F are schematic diagrams of the main cross-sectional structures produced by the principal processes in the semiconductor laser manufacturing method according to a preferred embodiment of the present invention;

FIGS. 2A through 2H are schematic diagrams for the primary cross-sectional structures obtained by the chief processes in the semiconductor laser manufacturing method in accordance with another embodiment of the present invention;

FIG. 5 is a cross-sectional view of another semiconductor laser that allows the application of the manufacturing methods of the present invention depicted in FIGS. 2A to 2H.

DETAILED DESCRIPTION OF THE PREFERRED EMBODIMENTS

Figure 1E:
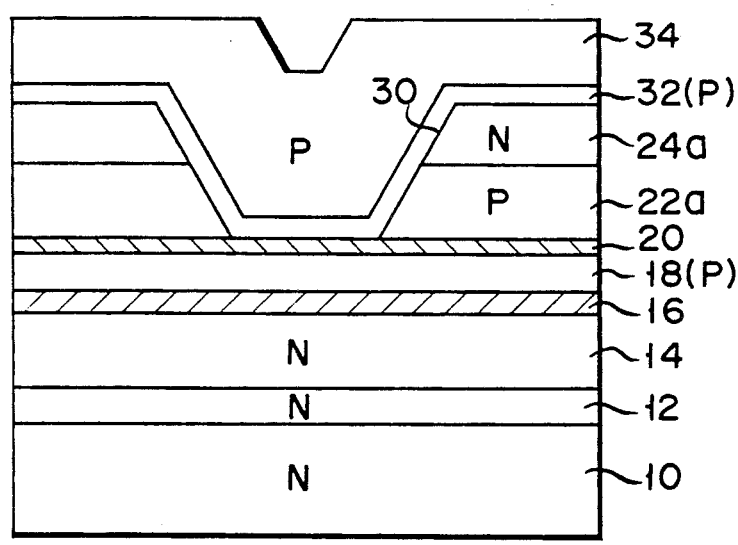

In FIG. 1A, for the manufacture of a semiconductor laser according to one preferred embodiment of the present invention, a semiconductive substrate 10 of the N type conductivity is first prepared. The N type substrate 10 may be an N type semiconductor substrate made from gallium arsenide (GaAs). Formed on the N type GaAs substrate 10 is a semiconductor buffer layer 12 of the N type conductivity, which is made from indium gallium phosphide (InGaP). The layer 12 may also be an N type GaAs layer. The cross-sectional views in FIG. 1A and subsequent figures are presented solely for the sake of clarity, and it should be noted that the dimensions in those figures do not agree with those of the actual device.

Formed on the N type InGaP buffer 12 is an N type cladding layer 4, which may be an $In_{0.5}(Ga_{0.3}Al_{0.7})_{0.5}P$ layer. The cladding layer 14 acts as a first cladding layer of the laser device. On the N type cladding layer 14, a nondoped InGaP active layer 16 and a P type $In_{0.5}$-

(Ga$_{0.3}$Al$_{0.7}$)$_{0.5}$P cladding layer 18 are formed in sequence. These layers 14, 16, and 18 are formed sequentially by a known crystal growing technique such as the metal organic chemical vapor deposition, or MOCVD, method to form a double-heterostructure section.

On P type cladding layer 18, a nondoped or P type InGaP thin-film layer 20, which serves as an etching stopper, is formed. If the InGaP layer 20 is thin, it will not function as an etching stopper effectively; theoretically, the thicker the layer 20, the better. Once the semiconductor laser has been completed, the etching stopper 20 acts to some extent as an absorption layer against the oscillation light. Accordingly, it is recommendable to set the thickness of the InGa etching stopper layer 20 in the range of 2 nanometers to 10 nanometers. It is because if the layer 20 is thinner than 2 nanometers, it cannot function as an etching stopper, while if it is thicker than 10 nanometers, it absorbs the oscillation light in the semiconductor laser to such an extent that the effect cannot be ignored. In this embodiment, the thickness of the InGaP layer 20 was set at 5 nanometers.

A P type In$_{0.5}$(Ga$_{0.3}$Al$_{0.7}$)$_{0.5}$P layer 22 is formed on the etching stopper layer 20. The P type layers 18 and 22 will act as second cladding layers as explained later. It should be noted that the etching stopper layer 20 is sandwiched between these P type cladding layers 18 and 22. On the upper P type cladding layer 22, an N type GaAs current-blocking layer 24 is formed.

As shown in FIG. 1B, a photoresist layer 26 is deposited on the top surface of the resultant multi-layered structure. The photoresist layer 26 is subjected to a known photopatterning processing, which produces a patterned photoresist layer 26a with an opening 28 in the selected region as shown in FIG. 1C.

The photoresist layer 26a with the opening 28 is used as a mask layer, under which there is the N type current-blocking layer 24, which is selectively etched by means of a mixed solution (known as the "SH etchant") containing sulfuric acid, hydrogen-peroxide solution, and water at a volume ratio of 3:1:1 (first stage etching). By using the etched N type current-blocking layer 24a as a mask, the P type cladding layer 22 under the mask is etched with another etchant such as hot sulfuric acid. The etching action of the layer 22 is continued until the top surface of the etching stopper 20 below the layer 22 appears (the second stage etching). Through such a two-stage etching procedure, the etched layers 22a and 24a form a long, narrow concave section 30 with a basically inverse-trapezoidal cross-section. In the description that follows, the concave section 30 will be called the "inverse-mesa-type stripe-shaped section" or the "inverse-mesa-type groove section", according the conventions of this technical filed.

After the completion of the preceding etching process, the patterned mask layer 26a is removed. Then, a P type In$_{0.5}$(Ga$_{0.5}$Al$_{0.5}$)$_{0.5}$P layer 32 and a P type In$_{0.5}$(Ga$_{0.3}$Al$_{0.7}$)$_{0.5}$P layer 34 are formed on layers 20, 22a, and 24a in sequence so as to cover the inverse-mesa type groove section 30, as shown in FIG. 1E. The P type layer 32 acts as an optical waveguide layer for the semiconductor laser, whereas the P type layer 34 serves as a fourth cladding layer if the layers 14, 18, and 22 are a first, a second, and third cladding layer, respectively.

Figure 1F:
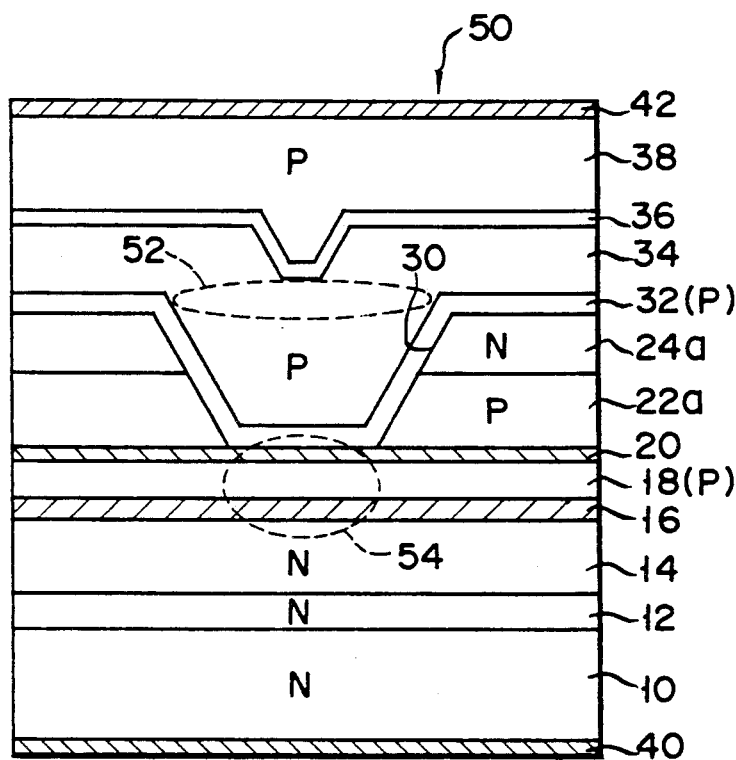

A P type InGaP thin-film layer 3 is then formed on the P type layer 34 as shown in FIG. 1F. On top of this, a P type GaAs ohmic contact layer 38 is formed. The InGaP thin-film layer 36 has a band-gap value preselected so as to fall between the band-gap values of the upper and lower layers 38 and 34 between which the layer 36 is sandwiched, thereby permitting it to function as an intermediate band-gap layer. Lastly, on the bottom surface of the N type substrate 10, a metallic layer 40 is formed and, at the same time, on the flat top surface of the ohmic contact layer 38, a metallic layer 42 is formed. These metallic layers 40 and 42 act as electrodes for the semiconductor laser. Now the processes so far described have completed a semiconductor laser 50 with the effective refractive index waveguide structure according to the preferred embodiment of the present invention.

In the semiconductor laser 50 with the cross section shown in FIG. 1F, the inverse-mesa-type groove section 30 is formed in the stacked component consisting of the third cladding layer 22a on which the current-narrowing layer 24a is placed. In FIG. 1F, the region into which current required for laser light oscillation in the semiconductor laser 50 is injected is roughly represented in a dotted line 52, while the region in which the oscillation laser light is confined, or the optical waveguide region is indicated by a broken line 54. As seen from the figure, in the semiconductor laser 50 according to the embodiment of the present invention, the inverse-mesa-type groove section 30 formed in the P type cladding layer 22a and the N type current-blocking layer 24a causes the width of the optical confinement region 54 to be substantially narrower than that of the current-injection region 52.

With such an arrangement, the injection current flow is confined in the region 52 corresponding to the upper opening section of the inverse-mesa-type groove section. The emission of light takes place in and around the central region of the active layer 16 immediately below the current injection region 52, resulting in laser oscillation. The optical field exuding toward the third cladding layer 22a is effectively confined in the region 54 due to the refractive-index difference at the boundary between the optical waveguide region 54 and the third cladding layer 22a, thereby minimizing the absorption loss of the oscillation light. The narrower width of the region 54 than that of the region 52 further increases the optical confinement efficiency, which makes the astigmatism still smaller, thus improving the light-emission efficiency. Such a propagation state of oscillation light may be considered to resemble a fundamental transverse-mode oscillation.

The aforementioned manufacturing method of the semiconductor laser 50 having the inverse-mesa-type groove section is characterized mainly by the use of the etching stopper layer 20 placed between the double-heterostructure section and the third cladding layer 22a thereon. More specifically, in performing the two-stage etching of the inverse-mesa-type groove section 30 into the third cladding layer 22 and current-narrowing layer 24, use of the etching stopper layer 20 with a suitably selected thickness prevents undesirable overetching almost perfectly. This facilitates the high-accuracy control of etching conditions for manufacturing processes such as accurate thickness control of the bottom of the striped groove section 30. This feature will be very helpful to semiconductor manufacturers who are to fabricate semiconductor lasers 50 with an accurately-dimensioned inverse-mesa-type groove section 30.

Additionally, use of the etching stopper layer 20 consisting of a completely-aluminum(Al)-free semiconductor layer, or an indium gallium phosphide layer, achieves the layer 32 crystal-grown on the etching stopper with a very high crystallizability, which improves the current-voltage characteristics of the semiconductor laser 50. This not only contributes to the prevention of kink and an improvement in the linearity of the current-light output characteristics, but also allows the expectation of an improvement in the temperature characteristics of the semiconductor laser 50.

A second embodiment of the present invention will be explained hereinafter, referring to FIGS. 2A through 2H. It should be noted that the size of the cross-sectional structures in these drawings does not match their actual size.

In FIG. 2A, on an N type GaAs substrate 100 prepared beforehand, an N type GaAs buffer 102, an N type $In_{0.5}(Ga_{0.3}Al_{0.7})_{0.5}P$ layer 104, a nondoped $In_{0.5}Ga_{0.5}P$ layer 106, and a P type $In_{0.5}(Ga_{0.3}Al_{0.7})_{0.5}P$ layer 108 are formed in sequence by using an existing crystal growth technique, such as the MOCVD method. The N type layer 104, once the semiconductor laser has been completed, functions as a first cladding layer. The layers 106 and 108 act as an active layer and a second cladding layer, respectively. Layers 104, 106, and 108 constitute a double-heterostructure section.

On the second P type cladding layer 108, a P type aluminum-free semiconductive thin film of gallium family such as an InGaP layer 110 is then formed. Formed sequentially on the P type InGaP thin-film layer 110 are a P type $In_{0.5}(Ga_{0.3}Al_{0.7})_{0.5}P$ layer 112, a P type aluminum-free gallium-family semiconductive thin film such as a P type InGaP layer 114, and an N type GaAs layer 116. The layer 116 corresponds to a current-blocking layer.

Then, on the N type current-blocking layer 116, a photoresist layer 118 is deposited as shown in FIG. 2B. After this, the photoresist layer 118 is subjected to a known photopatterning processing, which produces a long, narrow opening 120 in and around the central region of the photoresist layer 118. The opening 120 may be called the stripe-shaped opening.

By using the etched photoresist layer 118a with the stripe-shaped opening 120 as a mask, the N type current-blocking layer 116 immediately below the layer 118a is etched. The etchant used here was a mixed solution containing sulfuric acid, hydrogen-peroxide solution, and water at a volume ratio of 3:1:1 (the solution generally known as the "SH etchant"). With such etching processes, what is called "side etching" occurs in the N type GaAs current-blocking layer 116, in which a stripe-shaped opening 122 is formed which is sufficiently wider than the mask opening 120.

It should be noted that since the entire top surface of the P type $In_{0.5}(Ga_{0.3}Al_{0.7})_{0.5}P$ cladding layer 112 below the etched current-blocking layer 116a are covered with the P type InGaP thin-film 114, it remains totally insensitive to the side-etching action being taking place in the current-blocking layer 116a, meaning that the thin-film layer 114 functions as an etching stopper layer. Thus, even when the etching processing time is prolonged to obtain the desired width of the stripe-shaped opening 122 in the N type GaAs layer 116a, this arrangement securely prevents the layer 112 underlying the layer 116 from being affected by the etching process.

Figure 2D:
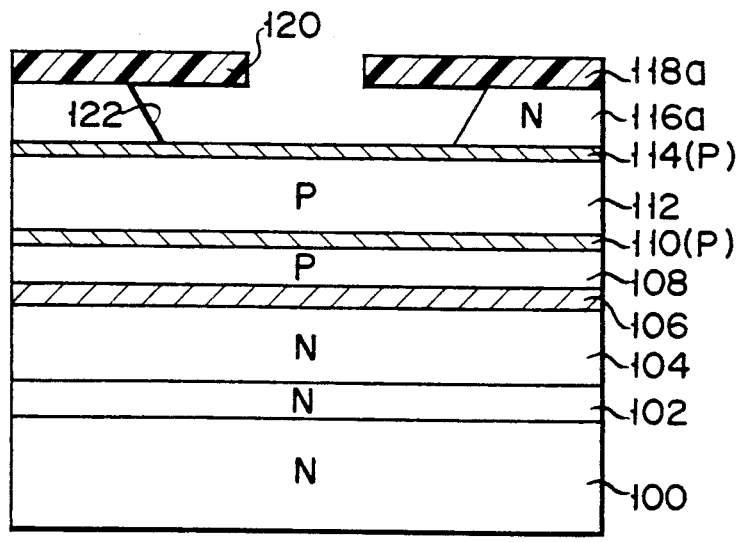
Figure 2E:
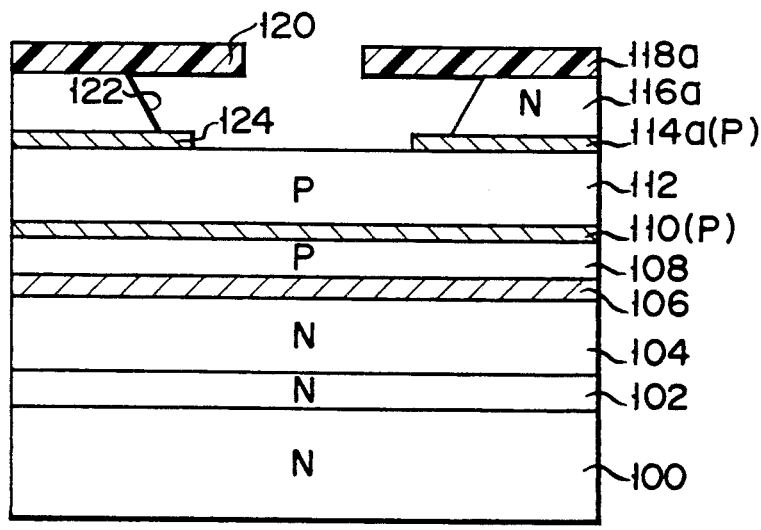

After the completion of the aforesaid etching process, the etching stopper layer 114 sandwiched between the etched layer 116a and the P type $In_{0.5}(Ga_{0.3}Al_{0.7})_{0.5}P$ layer 112 is etched by using an etchant that are highly corrosive to InGaP and, at the same time, extremely less corrosive to GaAs and InGaAlP, that is, an etchant that allows highly selective etching. During the etching process, the patterned mask layer 118a remains unchanged. As an etchant for etching the etching stopper layer 114, a solution of hydrogen bromide family is recommendable, for example. Use of a hydrogen-bromide-family etchant accelerates the supply of etching solution only just below the opening 120 of the photoresist mask layer 118a. Therefore, the InGaP thin film 114 was etched rapidly at the central portion corresponding to the place immediately below the opening 120, whereas the surrounding portions were hardly etched. As a result, the stripe-shaped opening 124, whose width is larger than that of the mask opening 120 and smaller than that of the opening 122 of the N type current-blocking layer 116a, is formed in the P type InGaP etching stopper layer 114a, as shown in FIG. 2E.

Figure 2F:
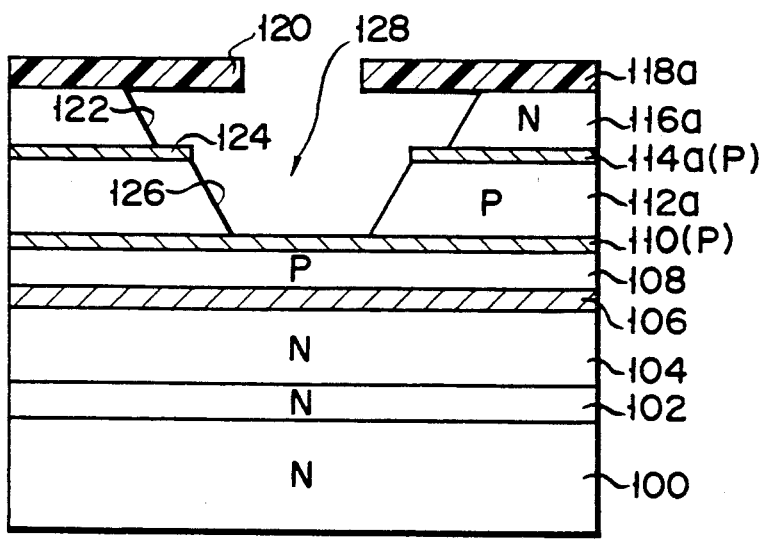

Then, as shown in FIG. 2F, by means of the etched InGaP layer 114a having the opening 124 as a mask, the P type $In_{0.5}(Ga_{0.3}Al_{0.7})_{0.5}P$ cladding layer 112 is etched by using hot sulfuric acid, which acts chemically on InGaAlP only. Thus, the underlying $In_{0.5}(Ga_{0.3}Al_{0.7})_{0.5}P$ cladding layer 112 is etched so as to define a stripe-shaped opening 126 with an inverse-mesa cross section just below the opening 124. During the etching process, the remaining layers 114a, 116a, and 118a retains their shapes as they were first etched into. It should be noted that since the InGaP thin film 110 that functions as an etching stopper layer lies between the P type cladding layer 112a being etched and the P type $In_{0.5}(Ga_{0.3}Al_{0.7})_{0.5}P$ cladding layer 108 below the layer 112a, this prevents the underlying layer 108 from being etched unexpectedly. The etching process at layer 112a, therefore, can progress smoothly without additional limitations until the opening 126 takes the desired cross section.

The above-mentioned multi-etching processes, the openings 122, 124, and 126 of the N type current-blocking layer 116a, the InGaP thin film 114a, and the third P type cladding layer 112 present, as shown in FIG. 2F, a steps-like inverse-mesa cross section, which is called here a "stepped inverse-mesa-shaped opening 128." This opening 128 may also be expressed as a stripe-form groove narrower at the bottom and wider at the top.

After removal of the photoresist mask layer 118a, a P type $In_{0.5}(Ga_{0.5}Al_{0.5})_{0.5}P$ layer 130 is formed by crystal growth to entirely cover the exposed surfaces of the stepped inverse-mesa groove section 128. The P type layer 130 serves as an optical waveguide layer. On the P type optical waveguide layer 130, a P type $In_{0.5}(Ga_{0.3}Al_{0.7})_{0.5}P$ layer 132 is formed to a predetermined thickness.

Figure 2G:
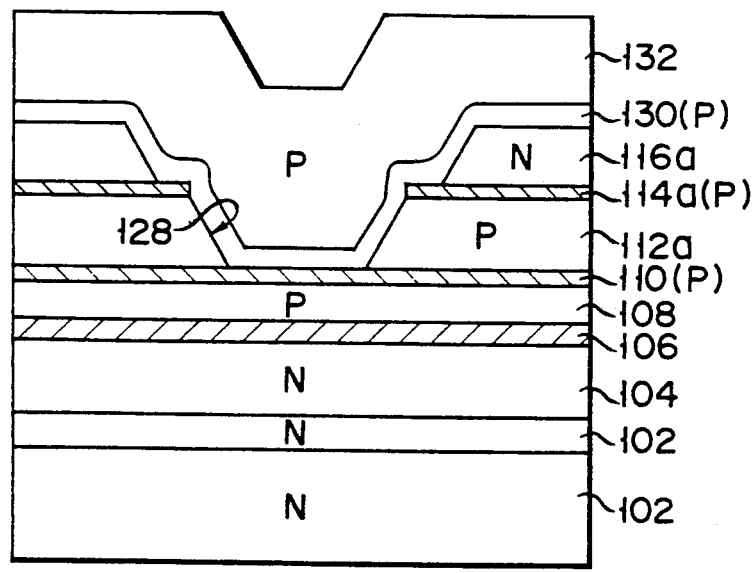
Figure 2H:
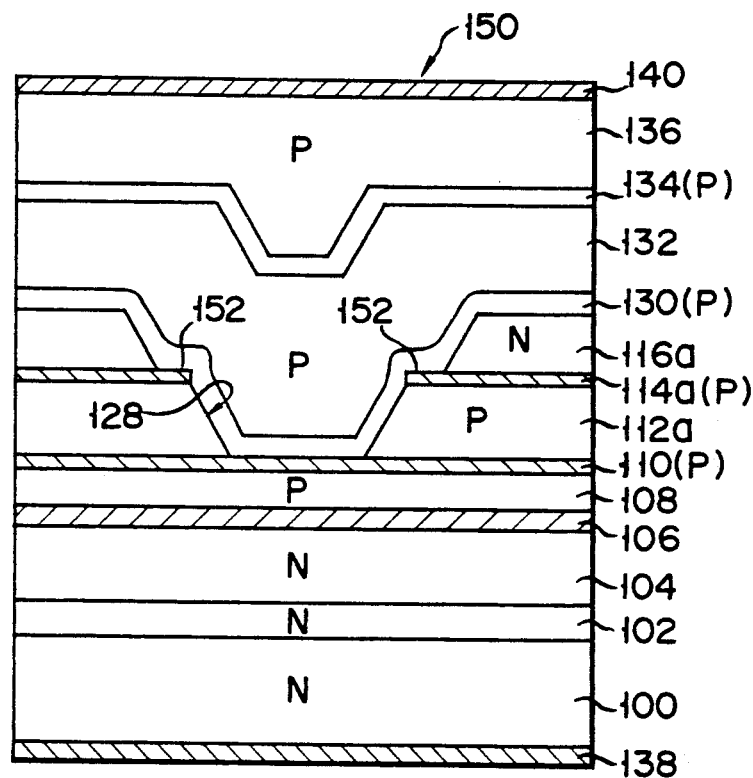

After this, as shown in FIG. 2H, a P type $In_{0.5}Ga_{0.5}P$ intermediate band-gap layer 134 and a P type GaAs contact layer 136 are formed sequentially on the top surface of the stacked layer component of FIG. 2G. Finally, an AuGe layer 138 and an AuZn layer 140 are formed on the substrate 100 and the P type contact layer 136, respectively, which completes the semiconductor laser 150 according to the second embodiment of the present invention. The AuZn layer 138 acts as the P-side electrode in the semiconductor laser 150, while the AuGe layer 138 functions as the N-side electrode.

In the semiconductor laser 150 having the stepped inverse-mesa groove section 128 of FIG. 2H, basically like the previous embodiment 50, the narrower optical confinement region than the exciting current injected region increases the confinement efficiency of oscillated laser light, allowing the light beam to converge on an extremely small spot with high accuracy.

In addition to this, in the stepped inverse-mesa groove structure of the semiconductor laser 150, the P type $In_{0.5}(Ga_{0.5}Al_{0.5})_{0.5}P$ optical waveguide layer 130 is partially mounted over the inner top surfaces 152 of the P type InGaP thin-film layer 114a serving as the upper etching stopper layer. In the partially mounted portion, the optical waveguide layer 130 chemically containing aluminum (Al) can be said to be electrically connected, via the P type etching stopper layer 114a totally free from aluminum, to the P type cladding layer 112a under the stopper layer 114a. This arrangement promotes the supply of injected current at the surfaces 152 of the layer 114a, making a great contribution to improving the light emission efficiency of the semiconductor laser 150.

Use of manufacturing processes thus far explained referring to FIGS. 2A through 2H enables the stable manufacture of semiconductor lasers 150 with a higher manufacturing yield through a remarkably simplified manufacturing procedure, without using currently risky, special techniques at all. In particular, use of the side etching technique explained mainly in FIG. 2D allows the highly accurate fabrication of the complex internal configuration of the stepped inverse-mesa groove structure 128 while maintaining the good crystal quality, without additional photoresist patterning processes.

Figure 3:
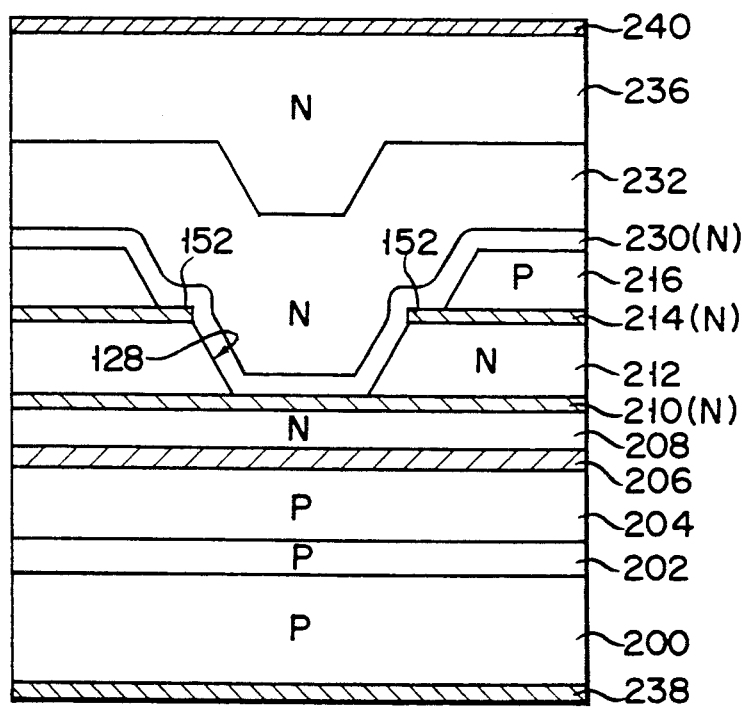
FIG. 3 illustrates a cross-sectional structure of a modification of the first embodiment in connection with the present invention of FIG. 2H.

The semiconductor laser 150 of FIG. 2H may be modified as shown in FIG. 3, wherein each layer is opposite in the conductivity type to that in the semiconductor laser 150 of FIG. 2H. More specifically, this modified semiconductor laser contains a P type GaAs substrate 200, a P type $In_{0.5}Ga_{0.5}P$ buffer layer 202, a first cladding layer 204 of the P type $In_{0.5}(Ga_{0.3}Al_{0.7})_{0.5}P$, a nondoped $In_{0.5}Ga_{0.5}P$ active layer 206, a second cladding layer 208 of the N type $In_{0.5}(Ga_{0.3}Al_{0.7})_{0.5}P$, and an N type InGaP first etching stopper layer 210. A third cladding layer 212 of the N type $In_{0.5}(Ga_{0.3}Al_{0.7})_{0.5}P$ is formed on the layer 210. An N type InGaP second etching-stopper layer 214 and a P type GaAs current-blocking layer 216 are formed by the MOCVD method so as to provide the aforementioned stepped inverse-mesa groove structure 128. An N type $In_{0.5}(Ga_{0.5}Al_{0.5})_{0.5}P$ optical waveguide layer 230 is formed so as to cover the stepped inverse-mesa groove structure 128. On the optical waveguide layer 230, a fourth cladding layer 232 of the N type $In_{0.5}(Ga_{0.3}Al_{0.7})_{0.5}P$ and an N type GaAs contact layer 236 are formed in sequence. On the P type substrate 200, an AuZn layer 238 is formed as a P-side electrode, and on the N type contact layer 236, an AuGe layer 240 is produced as an N-side electrode.

With such a reversed-PN cross-sectional structure, the contact layer 236 especially designed to have the N type conductivity eliminates the intermediate band-gap layer 134 used in the embodiment of FIG. 2H. This is because the injection current tends to flow smoothly between the N type InGaAlP layer 232 and the N type GaAs layer 236 even in the absence of such an intermediate band-gap layer.

It should be noted that the multi-etching processes according to the manufacturing method in connection with the present invention in FIGS. 2A through 2H are not restricted to the inverse-mesa cross-sectional groove section 128 previously described and may be applied to the manufacture of other types of semiconductor lasers having a stepped cross-sectional structure.

Figure 4:
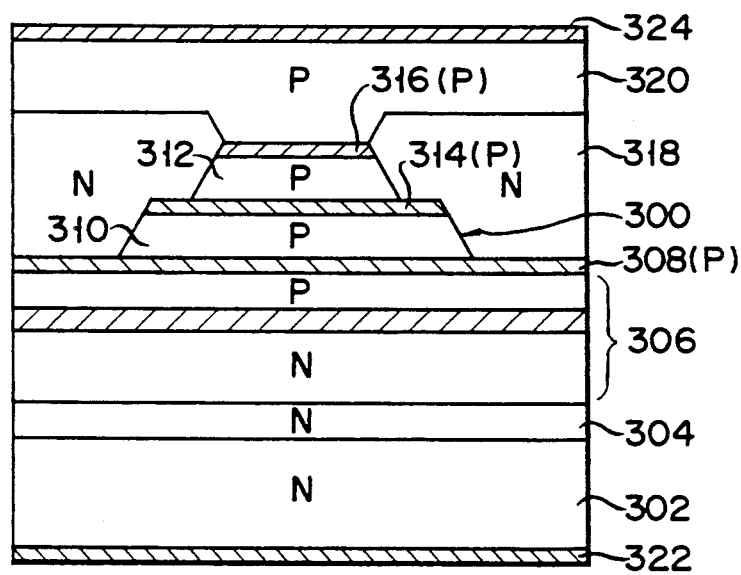
FIG. 4 is a cross-sectional view for a semiconductor laser to which the manufacturing methods of the present invention illustrated in FIGS. 2A through 2H are applicable.

FIG. 4 illustrates the cross-sectional structure of a typical semiconductor laser to which the manufacturing method according to the present invention is applicable. This semiconductor laser is characterized in that the optical waveguide region has the stepped inverse-mesa stripe-shaped protruding section 300 instead of the stepped inverse-mesa groove structure 128.

More specifically, an N type GaAs substrate 302 has an N type buffer layer formed on its top surface. Formed on the N type buffer layer 304 is a double-heterostructure section 306 comprised of an N type and a P type $In_{0.5}(Ga_{0.3}Al_{0.7})_{0.5}P$ cladding layer between which a nondoped active layer is sandwiched. On the double-heterostructure section 306, a P type InGaP thin-film layer 308 is formed as an etching stopper layer.

On the etching stopper layer 308, P type $In_{0.5}(Ga_{0.3}Al_{0.7})_{0.5}P$ cladding layers 310 and 312 are formed in that order to take a trapezoidal cross section tapering off to the top. The top layers of the P type cladding layers 310 and 312 have P type InGaP etching-stopper layers 314 and 316 formed on them, respectively. The etching technique by which the etching stopper layers 314 and 316 suitably define the complicated shape of the side surfaces of the stepped inverse-mesa/stripe-shaped protruding section 300 precisely follows the basic concept of the aforementioned multi-etching technique.

An N type current-blocking layer 318 is formed so as to cover both side surfaces of the stepped inverse-mesa/stripe-shaped protruding section 300. A P type GaAs contact layer 320 is placed so as to cover the top surface of the resultant multi-layered structure. Formed on the N type substrate 302 is an N-side electrode layer 322, whereas formed on the contact layer 320 is a P-side electrode layer 324.

The manufacturing method according to the present invention facilitates the manufacture of multi-stepped inverse-mesa/stripe-shaped protruding sections 350 with additional stepped portions, wherein a P type $In_{0.5}(Ga_{0.3}Al_{0.7})_{0.5}P$ cladding layer 352 and a P type InGaP etching-stopper layer 354 are formed sequentially on the layer 316.

What is claimed is:

1. A semiconductor laser device comprising:
 a semiconductive substrate of a first conductivity type;
 a double-heterostructure section provided above said substrate and having a first cladding layer of a first conductivity type, an active layer provided on said first cladding layer, and a second cladding layer of a second conductivity type provided on said active layer;
 a third cladding layer provided above said second cladding layer;
 a current-blocking layer provided on or above said third cladding layer;
 said third cladding layer and said current-blocking layer having in a preselected region a groove section which is crosssectionally arranged so that an optical confinement region of said laser device is smaller in width than a current injection region thereof;
 an optical waveguide layer of the second conductivity type provided on said third cladding layer and said current-blocking layer so as to cover said groove section; and a fourth cladding layer of the second conductivity type provided on said optical waveguide layer.

2. The device according to claim 1, wherein said groove section has a substantially inverse-trapezoidal cross section.

3. The device according to claim 1, wherein said groove has a shape of step in a position corresponding to a junction interface between said third cladding layer and said current-blocking layer and, as a whole, presents a quasi-inverse-trapezoidal cross section.

4. The device according to claim 1, further comprising:
a semiconductive thin-film layer positioned on said second cladding layer, essentially chemically insensitive to etching by a specific etchant, said thin-film layer defining a bottom surface of said groove section.

5. The device according to claim 2, further comprising:
a semiconductive thin-film layer, positioned on said second cladding layer, essentially chemically insensitive to etching by a specific etchant, said thin-film layer defining a bottom surface of said groove section.

6. The device according to claim 3, further comprising:
a first semiconductive thin-film layer, provided on said second cladding layer, essentially chemically insensitive to etching by a specific etchant, said thin-film layer defining a bottom surface of said groove section; and
a second semiconductive thin-film layer, sandwiched between said third cladding layer and said current-blocking layer, substantially chemically insensitive to etching by a specified etchant, said second thin-film layer defining the shape of step in said groove section.

7. The device according to claim 5, wherein said first, second and third cladding layers comprise a semiconductor material containing therein indium, gallium, aluminum and phosphorus, and wherein said thin film layer comprises a semiconductor material containing indium, gallium and phosphorus, and being free from aluminum.

8. The device according to claim 6, wherein said first, second and third cladding layers comprise a semiconductor material containing therein indium, gallium, aluminum and phosphorus, and wherein said first and second thin-film layers is made from semiconductor material containing indium, gallium and phosphorus, and being free from aluminum.

9. A semiconductor laser comprising:
a substrate of a first conductivity type;
a double-heterostructure section formed above said substrate, said double-heterostructure having a semiconductive active layer positioned between a first cladding layer of the first conductivity type and a second cladding layer of a second conductivity type;
a semiconductive layer formed on said second cladding layer for functioning as an etching stopper;
a third cladding layer formed on said semiconductive layer, said third cladding layer having a stripe-shaped concave section in and around its central portion;
a current-blocking layer formed on or above said third cladding layer, said current-blocking layer having a stripe-shaped concave section in and around its central portion, and said stripe-shaped concave sections forming a groove section with an inverse-trapezoidal cross-sectional profile that has a top opening and a bottom portion narrower than the top opening;
an optical waveguide layer of the second conductivity formed on said third cladding layer and said current-blocking layer so as to cover said groove section; and
a fourth cladding layer of the second conductivity type formed on said optical waveguide layer.

10. The laser according to claim 9, wherein said first, second and third cladding layers comprise a semiconductor material containing indium, gallium, aluminum and phosphorus, and wherein said semiconductive layer comprises a semiconductor material containing indium, gallium and phosphorus, and being free from aluminum.

11. The laser according to claim 10, wherein said semiconductive layer is same in its conductivity type as said second cladding layer.

12. The laser according to claim 11, further comprising:
an additional semiconductive layer of the same conductivity type as that of said current-blocking layer, which is formed as an etching stopper between said second cladding layer and said current-blocking layer and has an opening defining a width of an opening of said stripe-shaped concave section in said second cladding layer.

13. The laser according to claim 12, wherein said stripe-shaped concave section of said current-blocking layer is narrower at its bottom portion than said opening of said additional semiconductive layer, whereby said groove section defines a shape of steps in a certain portion corresponding to said additional semiconductive layer.

14. The laser according to claim 11, further comprising:
a contact layer of the second conductivity type formed above said fourth cladding layer.

15. The laser according to claim 14, further comprising:
a semiconductive layer of the second conductivity type which is sandwiched between said fourth cladding layer and said contact layer, and has a selected band gap which lies between those of the latter two layers.

16. The laser according to claim 15, further comprising:
a first conductive layer electrically connected to said substrate; and
a second conductive layer electrically connected to said contact layer.

* * * * *